(12) United States Patent
Kim et al.

(10) Patent No.: US 12,009,274 B2
(45) Date of Patent: Jun. 11, 2024

(54) SEMICONDUCTOR PACKAGE INCLUDING THERMAL EXHAUST PATHWAY

(71) Applicant: SAMSUNG ELECTRONICS CO., LTD., Suwon-si (KR)

(72) Inventors: Eungkyu Kim, Yongin-si (KR); Kyounglim Suk, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 251 days.

(21) Appl. No.: 17/358,149

(22) Filed: Jun. 25, 2021

(65) Prior Publication Data

US 2022/0262699 A1 Aug. 18, 2022

(30) Foreign Application Priority Data

Feb. 16, 2021 (KR) .................. 10-2021-0020382

(51) Int. Cl.
| | | |
|---|---|---|
| H01L 23/367 | (2006.01) | |
| H01L 23/00 | (2006.01) | |
| H01L 23/31 | (2006.01) | |
| H01L 23/498 | (2006.01) | |
| H01L 25/16 | (2023.01) | |

(52) U.S. Cl.
CPC ........ *H01L 23/367* (2013.01); *H01L 23/3128* (2013.01); *H01L 23/49822* (2013.01); *H01L 24/16* (2013.01); *H01L 24/32* (2013.01); *H01L 24/73* (2013.01); *H01L 25/16* (2013.01); *H01L 2224/16227* (2013.01); *H01L 2224/32225* (2013.01); *H01L 2224/73204* (2013.01)

(58) Field of Classification Search
CPC . H01L 25/0652; H01L 25/071; H01L 25/112; H01L 25/042; H01L 25/0655; H01L 25/072; H01L 25/0753; H01L 25/115; H01L 23/3677; H01L 23/3736; H01L 2224/06519; H01L 2224/17519; H01L 23/367; H01L 2225/06589; H05K 1/0204; H05K 1/0207; H05K 1/0203
See application file for complete search history.

(56) References Cited

U.S. PATENT DOCUMENTS

| | | | |
|---|---|---|---|
| 7,911,044 B2 | 3/2011 | Yang et al. | |
| 8,310,045 B2 | 11/2012 | Son | |
| 9,583,472 B2 | 2/2017 | Chung et al. | |
| 10,170,456 B2 | 1/2019 | Sung et al. | |
| 2008/0157341 A1 | 7/2008 | Yang et al. | |
| 2011/0304036 A1 | 12/2011 | Son | |
| 2014/0159247 A1* | 6/2014 | Lyne | H01L 23/49827 228/101 |
| 2016/0260695 A1 | 9/2016 | Chung et al. | |

(Continued)

*Primary Examiner* — Younes Boulghassoul
*Assistant Examiner* — Quinton A Brasfield
(74) *Attorney, Agent, or Firm* — Fish & Richardson P.C.

(57) ABSTRACT

A semiconductor package includes; a wiring structure including signal wiring and heat transfer wiring, an active chip on the wiring structure, a signal terminal disposed between the wiring structure and the active chip, a first heat transferring terminal disposed between the wiring structure and the active chip and connected to the heat transfer wiring, a passive chip on the wiring structure, a second heat transferring terminal disposed between the wiring structure and the passive chip and connected to the heat transfer wiring, and a heat spreader on the passive chip.

19 Claims, 11 Drawing Sheets

(56) References Cited

U.S. PATENT DOCUMENTS

| | | | |
|---|---|---|---|
| 2018/0175011 A1* | 6/2018 | Sung | ................... H01L 21/565 |
| 2018/0176006 A1* | 6/2018 | McElheny | ............. H04L 9/065 |
| 2018/0182700 A1* | 6/2018 | Sato | .................. H01L 21/4857 |
| 2019/0006341 A1* | 1/2019 | Lin | ..................... H01L 21/563 |
| 2019/0067152 A1* | 2/2019 | Wuu | ..................... H01L 23/36 |
| 2020/0027864 A1 | 1/2020 | Kim | |
| 2020/0273801 A1* | 8/2020 | Kim | ................... H01L 23/5385 |
| 2020/0344894 A1 | 10/2020 | Liu et al. | |
| 2020/0373244 A1 | 11/2020 | Kang et al. | |

* cited by examiner

SEMICONDUCTOR PACKAGE INCLUDING THERMAL EXHAUST PATHWAY

CROSS-REFERENCE TO THE RELATED APPLICATION

This non-provisional U.S. patent application claims priority from Korean Patent Application No. 10-2021-0020382 filed on Feb. 16, 2021 in the Korean Intellectual Property Office, the subject matter of which is hereby incorporated by reference.

BACKGROUND

1. Field

The inventive concept relates generally to semiconductor packages including a thermal path, as well as methods of manufacturing same.

2. Description of the Related Art

In view of commercial demands for electronic systems that are cheaper, lighter, thinner, functionally dense and easy to use, considerable research has been directed to the manufacture of semiconductor packages capable of effectively mounting multiple semiconductor chips. However, during operation each of these semiconductor chips may generate thermal energy (or heat) in excess of the surrounding environmental temperature. In some circumstances, the heat generated by single package-mounted semiconductor chips may degrade performance (or the useful lifespan) of the electronic system incorporating the semiconductor package or cause an outright failure of the electronic system.

SUMMARY

Embodiments of the inventive concept provide semiconductor packages providing efficient dissipation of heat from an active chip, as well as methods of manufacturing same.

In one embodiment, the inventive concept provides a semiconductor package including; a wiring structure including signal wiring and heat transfer wiring spaced apart from the signal wiring, an active chip on the wiring structure, a signal terminal disposed between the wiring structure and the active chip, a first heat transferring terminal disposed between the wiring structure and the active chip and connected to the heat transfer wiring, a passive chip on the wiring structure, a second heat transferring terminal disposed between the wiring structure and the passive chip and connected to the heat transfer wiring, and a heat spreader on the passive chip.

In another embodiment, the inventive concept provides a semiconductor package including; a wiring structure including signal wiring and heat transfer wiring, an active chip on the wiring structure and connected to the signal wiring and the heat transfer wiring, a passive chip on the wiring structure and connected to the heat transfer wiring, and a heat spreader on the passive chip.

In still another embodiment, the inventive concept provides a semiconductor package including; a redistribution layer including signal wiring and heat transfer wiring, an active chip on the redistribution layer, a signal terminal between the redistribution layer and the active chip, a first heat transferring terminal between the redistribution layer and the active chip and connected to the heat transfer wiring, a passive chip on the redistribution layer, a second heat transferring terminal disposed between the redistribution layer and the passive chip and connected to the heat transfer wiring, a heat spreader on the passive chip, an external terminal on a lower surface of the redistribution layer, and an encapsulant disposed on the redistribution layer between the active chip and the heat spreader.

BRIEF DESCRIPTION OF THE DRAWINGS

Embodiments of the inventive concept may be more clearly understood upon consideration of the following detailed description together with the accompanying drawings in which.

DETAILED DESCRIPTION

Throughout the written description and drawings, like reference numbers and labels will be used to denote like or similar elements, method steps and/or features. Hereinafter, embodiments of the inventive concept will be described in some additional detail with reference to the accompanying drawings.

Figures (FIGS. 1 to 7 are respective cross-sectional diagrams illustrating semiconductor packages according to embodiments of the inventive concept. Semiconductor packages consistent with various embodiments of the inventive concept may include fan-out wafer level packages (FOWLP), fan-in wafer level packages (FIWLP), panel level packages (PLP), package-on-package (PoP) arrangements, system-in-package (SIP) arrangements, and combinations of such.

Figure 1:
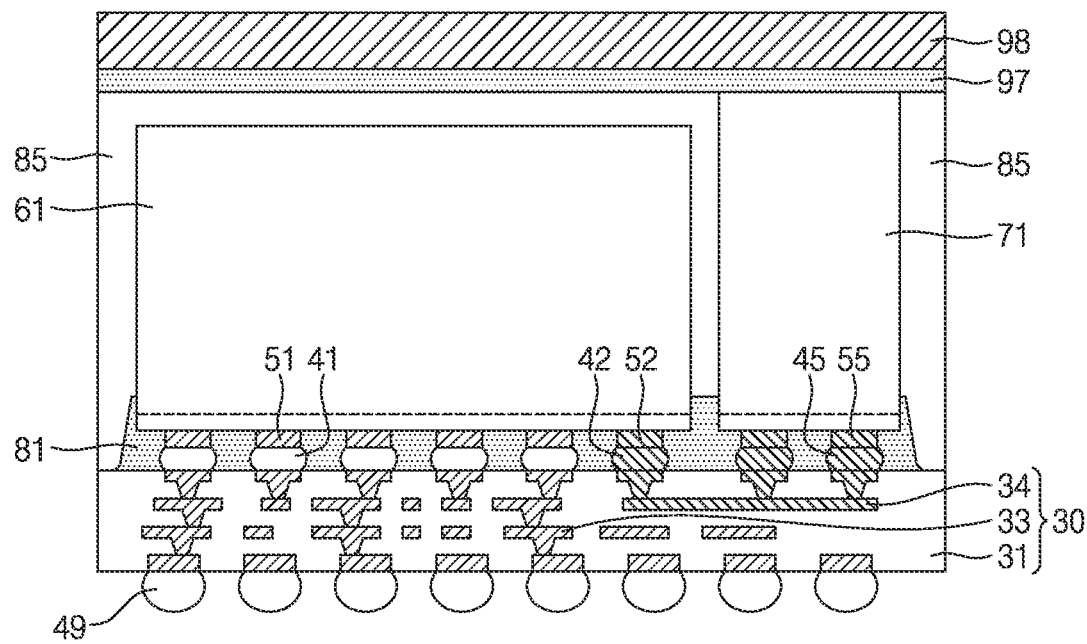
FIGS. 1, 2, 3, 4, 5, 6 and 7 (hereafter collectively, "FIGS. 1 to 7") are respective cross-sectional diagram illustrating semiconductor packages according to embodiments of the inventive concept.

Referring to FIG. 1, a semiconductor package 10 may include a wiring structure 30, one or more signal terminals 41, one or more first heat transferring terminals 42, one or more second heat transferring terminals 45, one or more external terminals 49, one or more signal pads 51, one or more first heat transferring pads 52, one or more second heat transferring pads 55, a first active chip 61, a passive chip 71, a first encapsulant 81, a second encapsulant 85, a thermal interface material (TIM) layer 97, and a heat spreader 98.

Here, the wiring structure 30 may include an insulating layer 31, signal wiring 33, and heat transfer wiring 34. In some embodiments, the wiring structure 30 may variously include one or more semiconductor chips (e.g., a logic chip, a buffer chip, a controller chip, an application processor chip, an interposer chip, a volatile memory chip, a non-volatile memory chip, or a combination thereof). Alternately or additionally, the wiring structure 30 may include a printed circuit board (PCB), an interposer substrate, one or more semiconductor chips, or a combination thereof. Alternately or additionally, the wiring structure 30 may include a redistribution layer (RDL). For example, the insulating layer 31 may include a polymer insulating layer (e.g., an Ajinomoto build-up film (ABF)).

Thus, the signal wiring 33 and/or the heat transfer wiring 34 may be disposed (wholly or in part) within the insulating layer 31. Here, the signal wiring 33 may variously include horizontal wiring, downward vertical extensions, upper pad(s), lower pad(s), or a combination thereof. The heat transfer wiring 34 may include horizontal heat transfer wiring, vertical heat transfer wiring, upper heat transferring pad(s), or a combination thereof. In this regard, the respective heat transfer wiring 34 may be physically spaced apart from the signal wiring 33.

The signal wiring 33 and/or the heat transfer wiring 34 may include a one or more conductive material, such as Cu, W, WN, Ni, Co, Al, Ti, TiN, Ta, TaN, Ag, Pt, Au, Ru, Cr or Sn.

As illustrated in FIG. 1, the first active chip 61 and the passive chip 71 may be variously "mounted" (i.e., mechanically assembled and/or electrically connected) on the wiring structure 30. In this regard, the first encapsulant 81 may be disposed between the wiring structure 30 and one or both of the first active chip 61 and the passive chip 71. The signal terminals 41 and the first heat transferring terminals 42 may be selectively disposed between the first active chip 61 and the wiring structure 30, whereas the second heat transferring terminals 45 may be selectively disposed between the passive chip 71 and the wiring structure 30.

The first active chip 61 may include the signal pads 51 and the first heat transferring pads 52. The first heat transferring pads 52 may be spaced apart from the signal pads 51. The signal terminals 41 may be exposed through the first encapsulant 81 to variously contact one or more of the signal pads 51 and/or the signal wiring 33. The first heat transferring terminals 42 may be exposed through the first encapsulant 81 to variously contact the first heat transferring pads 52 and/or the heat transfer wiring 34. In this regard, the first active chip 61 may include at least one of a logic chip, a buffer chip, a controller chip, an application processor chip, an interposer chip and a memory chip. For example, the first active chip 61 may include at least one of a volatile memory chip and a non-volatile memory chip.

The passive chip 71 may include the second heat transferring pads 55. The second heat transferring terminals 45 may be exposed through the first encapsulant 81 to variously contact the second heat transferring pads 55 and/or the heat transfer wiring 34. In this regard, the passive chip 71 may be a dummy chip having a configuration substantially similar to that of the first active chip 61. That is, the passive chip 71 may include one or more material(s) having a coefficient of thermal expansion substantially similar to that of the first active chip 61. For example, the passive chip 71 may include a semiconductor layer, such as a monocrystalline silicon layer. In some embodiments, the passive chip 71 may have a first "thickness" (e.g., measured in an arbitrarily defined vertical direction relative to a horizontal plane substantially parallel to a principal surface of the first active chip 61 when mounted on the wiring substrate 30) greater than a second thickness of the first active chip 61. Assuming that the first thickness of the passive chip 71 is greater than the second thickness of the first active chip 61 (as illustrated in FIG. 1), an upper surface of the passive chip 71 may be disposed at a higher "level" (e.g., measured in the vertical direction from an arbitrarily selected horizontal plane) than an upper surface of the first active chip 61.

Each of the signal terminals 41, the first heat transferring terminals 42, and the second heat transferring terminals 45 may be variously configured and may include at least one of a solder ball, a conductive bump, an under bump metallurgy (UBM), a conductive pillar, a conductive lead, a conductive pin, or a combination thereof. For example, each of the signal pads 51, the first heat transferring pads 52, and the second heat transferring pads 55 may include one or more conductive material(s) such as Cu, W, WN, Ni, Co, Al, Ti, TiN, Ta, TaN, Ag, Pt, Au, Ru, Cr and Sn.

The first encapsulant 81 may fill (wholly or in part) a space between the wiring structure 30 and the first active chip 61, and a space between the wiring structure 30 and the passive chip 71. In some embodiments, the first encapsulant 81 may partially cover side surfaces of the first active chip 61 and side surfaces of the passive chip 71.

In some embodiments, the first encapsulant 81 may include an underfill material including a filler and a resin. Here, the filler may include a spherical filler advantageous to securing an appropriate flowability of the first encapsulant 81. For example, the filler may include one or more of aluminum oxide ($Al_2O_3$), aluminum nitride (AlN), boron nitride (BN) and silicon oxide ($SiO_2$). In some embodiments, the first encapsulant 81 may include an epoxy molding compound. In some embodiments, the first encapsulant 81 may include a die attach film (DAF).

The second encapsulant 85 may be disposed on the wiring structure 30, to cover the side surfaces of the first active chip 61 and the side surfaces of the passive chips 71. In some embodiments, the second encapsulant 85 may also cover portions of the first encapsulant 81 partially covering the side surfaces of the first active chip 61 and the side surfaces of the passive chips 71.

In some embodiments, upper surfaces of the second encapsulant 85 and the passive chip 71 may be substantially coplanar. In some embodiments, the second encapsulant 85 may include an epoxy molding compound.

The TIM layer 97 may be disposed on the second encapsulant 85 and the passive chip 71. Here, the thermal interface material layer 97 may include one or more material(s) exhibiting excellent gap fill characteristics and excellent thermal conductivity. The heat spreader 98 may be disposed on the thermal interface material layer 97.

In this regard, the TIM layer 97 may directly contact (as sandwiched between) the upper surface of the second encapsulant 85/the upper surface of the passive chip 71 and the heat spreader 98. Thus, a portion of the second encapsulant 85 may be interposed between the TIM layer 97 and the first active chip 61.

The heat spreader 98 may include a three-dimensional (3D) structure having various shapes. The heat spreader 98 may include one or more material(s) exhibiting excellent thermal conductivity such as Cu or Al. Here, vertical spacing, if any, between the upper surface of the passive chip 71 and the heat spreader 98 may be less than vertical spacing between the upper surface of the first active chip 61 and the heat spreader 98.

The external terminals 49 may be variously disposed on a lower surface of the wiring structure 30. One or more of the external terminals 49 may be connected to the signal wiring 33. The external terminals 49 may be variously configured and may include at least one of a solder ball, a conductive bump, an under bump metallurgy (UBM), a conductive pillar, a conductive lead and a conductive pin. In some embodiments, the external terminals 49 may be omitted.

In view of the illustrated example of FIG. 1, embodiments of the inventive concept provide one or more thermal pathways that efficiently exhaust (e.g., spread or transferring-away) much of the heat generated by the first active chip 61 during its operation. For example, heat generated by the first active chip 61 may be efficiently spread via the first heat transferring pad 52, the first heat transferring terminal 42, the heat transfer wiring 34, the second heat transferring terminals 45, the second heat transferring pads 55, the passive chip 71, the thermal interface material layer 97, and the heat spreader 98.

Figure 2:
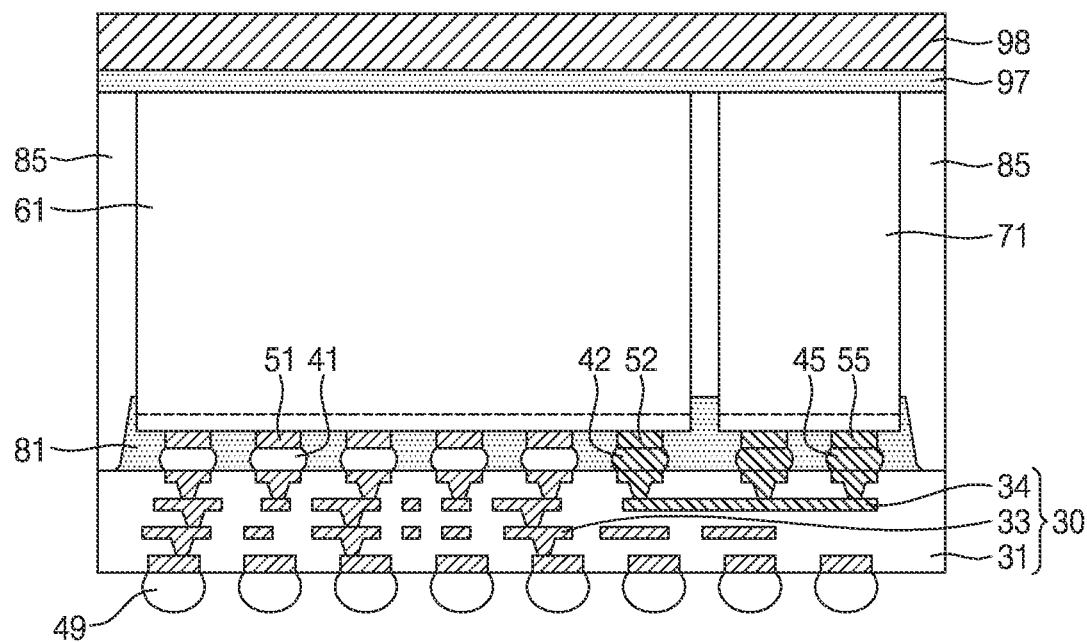

Referring to FIG. 2, a semiconductor package 20 according to embodiments of the inventive concept may include, analogous to the semiconductor package 10 of FIG. 1, the wiring structure 30, one or more signal terminals 41, one or more first heat transferring terminals 42, one or more second heat transferring terminals 45, one or more external terminals 49, one or more signal pads 51, one or more first heat transferring pads 52, one or more second heat transferring pads 55, the first active chip 61, the passive chip 71, the first encapsulant 81, the second encapsulant 85, the TIM layer 97 and the heat spreader 98.

However, the upper surface of the first active chip 61, the upper surface of the passive chip 71, and the upper surface of the second encapsulant 85 may be substantially coplanar. (As before, the second encapsulant 85 may cover side surfaces of the first active chip 61 and side surfaces of the passive chip 71). Thus, the TIM layer 97 may be directly disposed on the upper surface of the first active chip 61, the upper surface of the passive chip 71, and upper surface portions of the second encapsulant 85. The heat spreader 98 may be disposed on the TIM layer 97.

Figure 3:
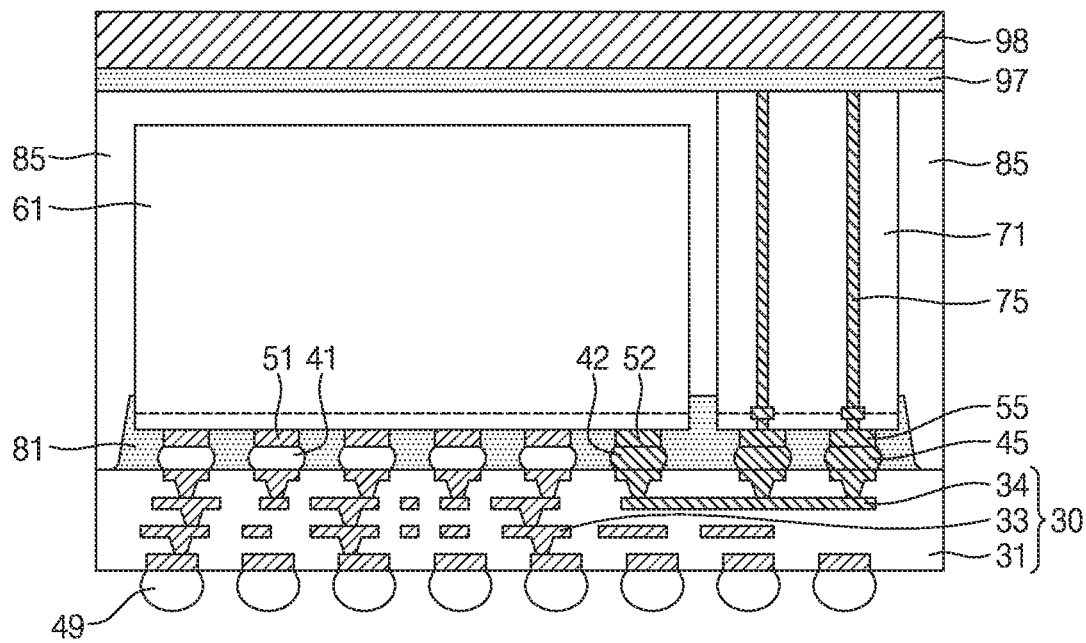

Referring to FIG. 3, a semiconductor package 30 according to embodiments of the inventive concept may include, analogous to the semiconductor package 10 of FIG. 1, the wiring structure 30, one or more signal terminals 41, one or more first heat transferring terminals 42, one or more second heat transferring terminals 45, one or more external terminals 49, one or more signal pads 51, one or more first heat transferring pads 52, one or more second heat transferring pads 55, the first active chip 61, the passive chip 71, the first encapsulant 81, the second encapsulant 85, the TIM layer 97, and the heat spreader 98.

Additionally, the semiconductor package 30 may include one or more through electrodes 75. In some embodiments, the through electrodes 75 may extend through the passive chip 71 to connect the TIM layer 97 and the second heat transferring pads 55. The through electrodes 75 may include one or more material(s) exhibiting excellent thermal conductivity, such as Cu, W, WN, Ni, Co, Al, Ti, TiN, Ta, TaN, Ag, Pt, Au, Ru, Cr, and Sn.

Figure 4:
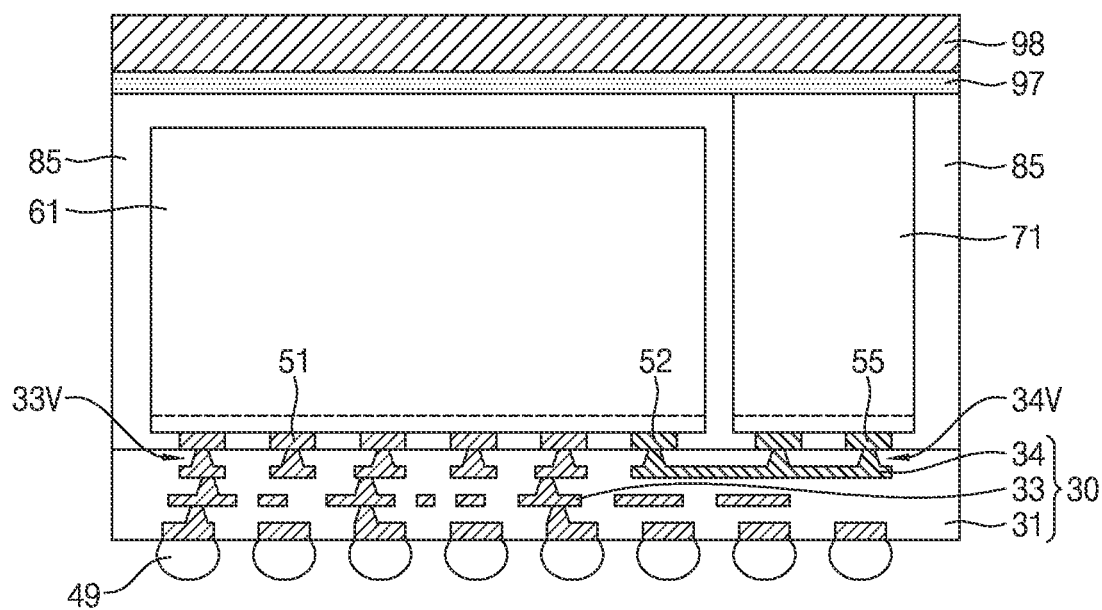

Referring to FIG. 4, a semiconductor package 40 according to embodiments of the inventive concept may include, analogous to the semiconductor package 10 of FIG. 1, the wiring structure 30, one or more external terminals 49, one or more signal pads 51, one or more first heat transferring pads 52, one or more second heat transferring pads 55, the first active chip 61, the passive chip 71, the second encapsulant 85, the TIM layer 97, and the heat spreader 98. That is, compared with the semiconductor package 10 of FIG. 1, the semiconductor package 40 of FIG. 4 omits the one or more signal terminals 41, the one or more first heat transferring terminals 42, the one or more second heat transferring terminals 45, and the first encapsulant 81.

Accordingly, the second encapsulant 85 may be formed between the wiring structure 30 and the first active chip 61, between the wiring structure 30 and the passive chip 71, on side surfaces of the first active chip 61, and on the side surfaces of the passive chip 71.

Here, the wiring structure 30 may again include the insulating layer 31, the signal wiring 33, and the heat transfer wiring 34. However, in this particular configuration, the signal wiring 33 may include horizontal signal wiring together with one or more upward vertical extensions 33V. And the heat transfer wiring 34 may include horizontal heat transfer wiring together with one or more upward vertical extensions 34V.

Thus, at least one of the signal pads 51 may contact a corresponding one of the upward vertical extensions 33V, and at least one of the first heat transferring pads 52 may contact a corresponding one of the upward vertical extensions 34V. In this regard, the upward vertical extensions 33V of the signal wiring 33 and the upward extensions 34V of the heat transfer wiring 34 may be variously shaped. However, in some embodiments, both the upward vertical extensions 33V of the signal wiring 33 and the upward extensions 34V of the heat transfer wiring 34 may have a shape characterized by an upper portion having a lesser "width" (e.g., measured along a horizontal plane) than a lower portion. That is, both of the upward vertical extensions 33V of the signal wiring 33 and the upward vertical extensions 34V of the heat transfer wiring 34 may have a width that gradually decreases as the respective vertical extensions extend upward.

Figure 5:
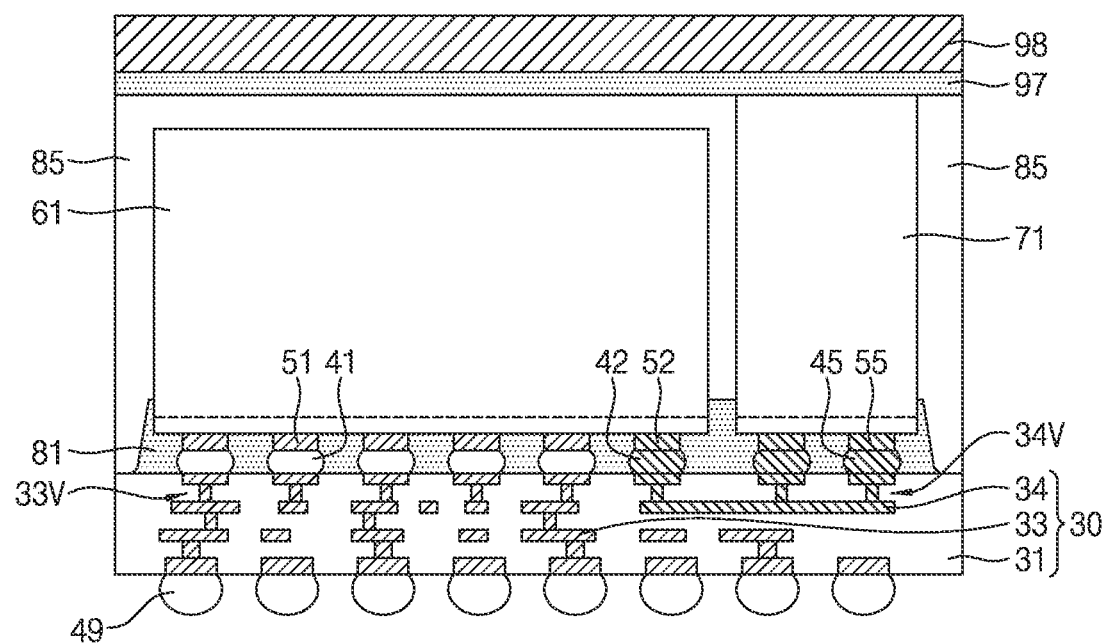

Referring to FIG. 5, a semiconductor package 50 according to embodiments of the inventive concept may include, analogous to the semiconductor package 10 of FIG. 1, the wiring structure 30, one or more signal terminals 41, one or more first heat transferring terminals 42, one or more second heat transferring terminals 45, one or more external terminals 49, one or more signal pads 51, one or more first heat transferring pads 52, one or more second heat transferring pads 55, the first active chip 61, the passive chip 71, the first encapsulant 81, the second encapsulant 85, the TIM layer 97, and the heat spreader 98. However, analogous to the semiconductor package 40 of FIG. 4, the wiring structure 30 may include signal wiring 33 that includes horizontal signal wiring together with one or more upward vertical extensions 33V, and heat transfer wiring 34 that includes horizontal heat transfer wiring together with one or more upward vertical extensions 34V. Here, however, both of the upward vertical extensions 33V of the signal wiring 33 and the upward vertical extensions 34V of the heat transfer wiring 34 are assumed to have a linear shape characterized by a consistent width.

Figure 6:
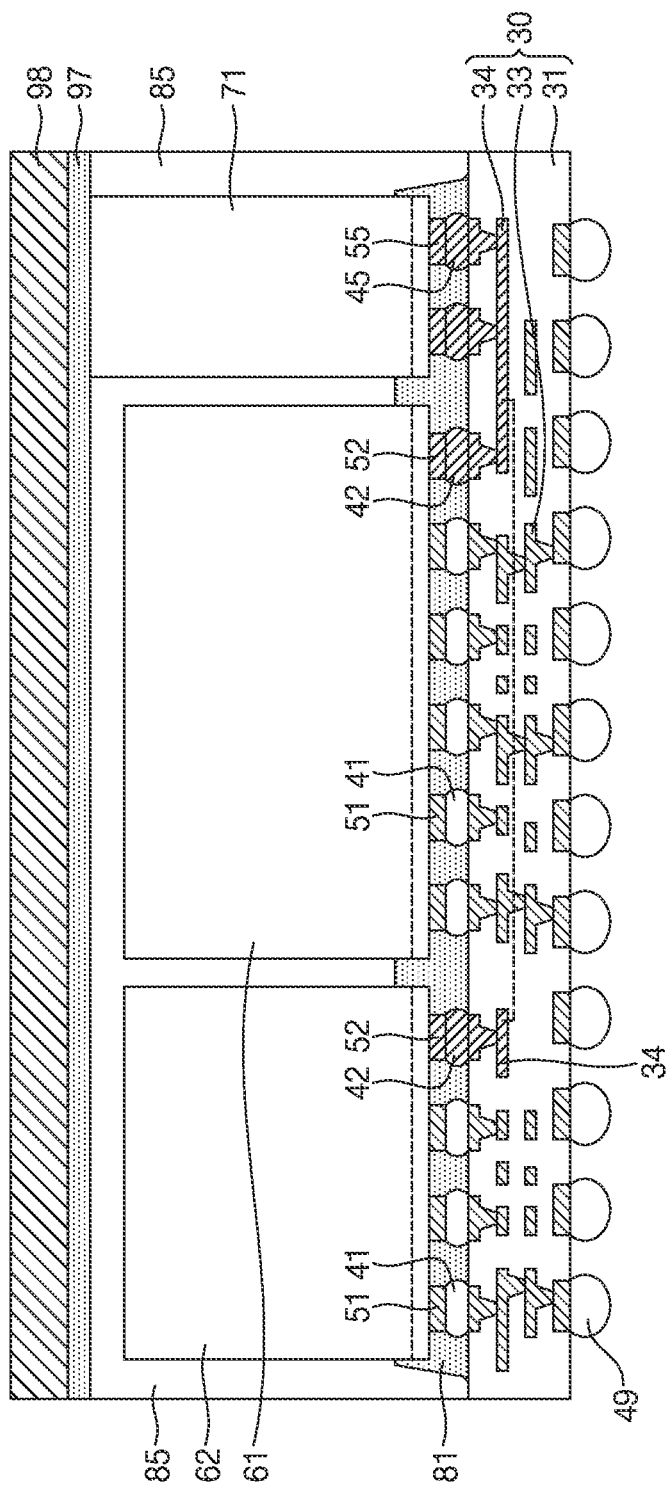

Referring to FIG. 6, a semiconductor package 60 according to embodiments of the inventive concept may include, analogous to the semiconductor package 10 of FIG. 1, the wiring structure 30, one or more signal terminals 41, one or more first heat transferring terminals 42, one or more second heat transferring terminals 45, one or more external terminals 49, one or more signal pads 51, one or more first heat transferring pads 52, one or more second heat transferring pads 55, the first active chip 61, the passive chip 71, the first encapsulant 81, the second encapsulant 85, the TIM layer 97 and the heat spreader 98. However, a second active chip 62 is additionally mounted on the wiring structure 30.

In some embodiments, each of the first active chip 61 and the second active chip 62 may include at least one of a logic chip, a buffer chip, a controller chip, an application processor chip, an interposer chip and a memory chip. In some embodiments, each of the first active chip 61 and the second active chip 62 may include a volatile memory chip and/or a non-volatile memory chip. In one particular embodiment, the first active chip 61 may include an application processor chip, and the second active chip 62 may include one or more memory chip(s).

Figure 7:
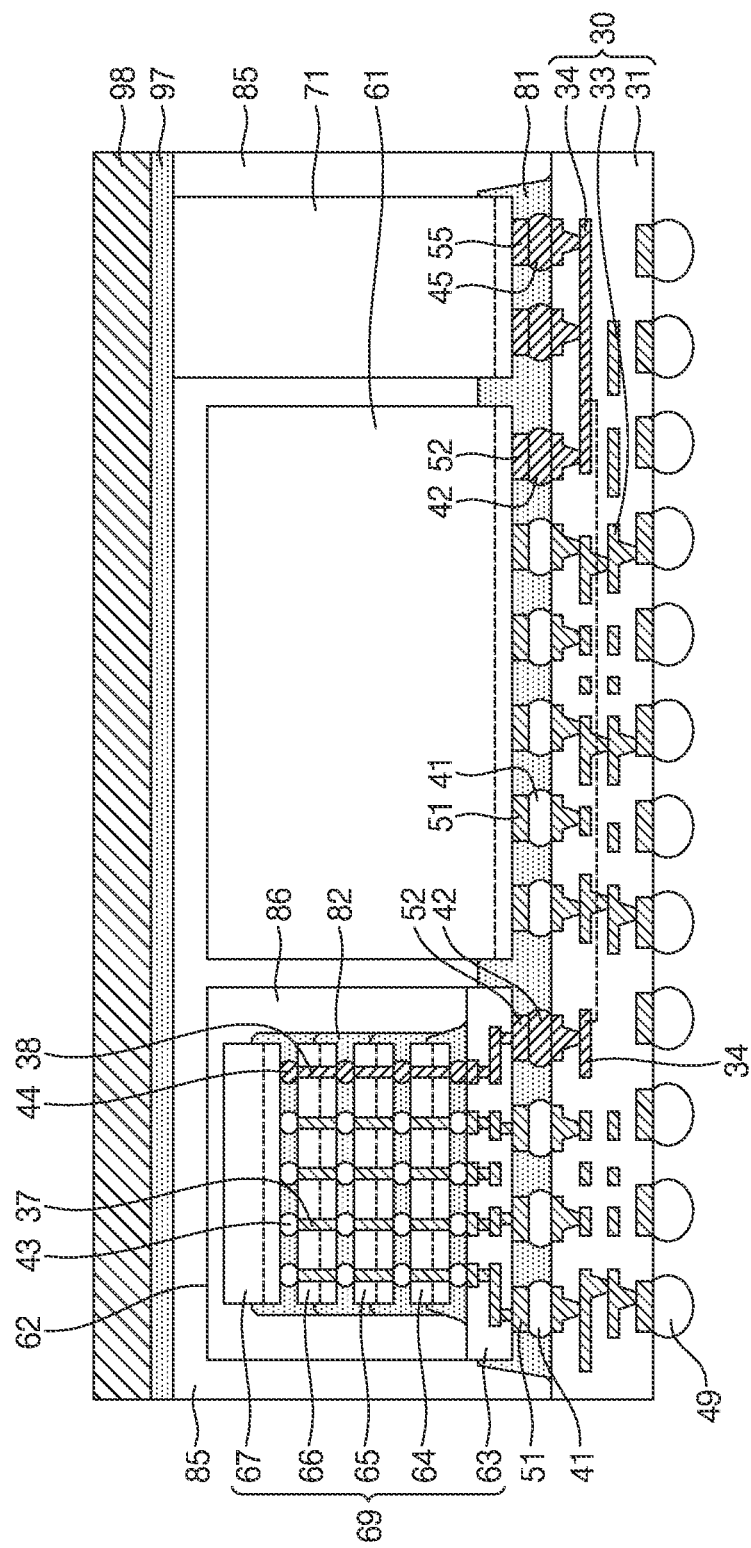

Referring to FIG. 7, a semiconductor package 70 according to embodiments of the inventive concept may include, analogous to the semiconductor package 60 of FIG. 6, the wiring structure 30, one or more signal terminals 41, one or more first heat transferring terminals 42, one or more second heat transferring terminals 45, one or more external terminals 49, one or more signal pads 51, one or more first heat transferring pads 52, one or more second heat transferring pads 55, the first active chip 61, the second active chip 62, the passive chip 71, the first encapsulant 81, the second encapsulant 85, the TIM layer 97 and the heat spreader 98.

Here however, one example of a particular constituent nature of the second active chip 62 is illustrated. In this regard, the second active chip 62 may include an inner package 69. In the illustrated example of FIG. 7, the inner package 69 may include an inner wiring structure 63, a third active chip 64, a fourth active chip 65, a fifth active chip 66, a sixth active chip 67, a third encapsulant 82, and a fourth encapsulant 86.

In some embodiments, the inner package 69 may include at least one semiconductor chip such as a logic chip, a buffer chip, a controller chip, an application processor chip, an interposer chip, a volatile memory chip, a non-volatile memory chip, or a combination thereof. The inner wiring structure 63 may include a redistribution layer (RDL), a printed circuit board, an interposer substrate, the semiconductor chip, or a combination thereof.

Each of the third active chip 64, the fourth active chip 65, the fifth active chip 66, and the sixth active chip 67 may include a logic chip, a buffer chip, a controller chip, an application processor chip, an interposer chip, a memory chip, or a combination thereof. Each of the third active chip 64, the fourth active chip 65, the fifth active chip 66, and the sixth active chip 67 may include a memory chip such as a volatile memory chip, a non-volatile memory chip, or a combination thereof. For example, each of the third active chip 64, the fourth active chip 65, the fifth active chip 66, and the sixth active chip 67 may include a volatile memory chip such as a dynamic random access memory (DRAM).

The third active chip 64, the fourth active chip 65, the fifth active chip 66, and the sixth active chip 67 may be sequentially stacked on the inner wiring structure 63. Inner signal terminals 43 and inner heat transferring terminals 44 may be variously disposed among the third active chip 64, the fourth active chip 65, the fifth active chip 66, and the sixth active chip 67. The third encapsulant 82 may be formed over side surfaces portion(s), bottom surface portion(s) and/or upper surface portion(s) of the third active chip 64, the fourth active chip 65, the fifth active chip 66, and the sixth active chip 67.

The inner heat transferring terminals 44 may be spaced apart from the inner signal terminals 43. Each of the inner signal terminals 43 and the inner heat transferring terminals 44 may be variously configured to include at least one of a solder ball, a conductive bump, an under bump metallurgy (UBM), a conductive pillar, a conductive lead, and a conductive pin. The third encapsulant 82 may include an underfill material including a filler and a resin. In some embodiments, the third encapsulant 82 may include a die attach film (DAF).

Each of the inner wiring structure 63, the third active chip 64, the fourth active chip 65, the fifth active chip 66, and the sixth active chip 67 may include inner signal wiring 37 and inner heat transfer wiring 38. The heat transfer wiring 38 may be spaced apart from the inner signal wiring 37.

The inner signal wiring 37 may include horizontally oriented wiring and/or vertically oriented wiring. In some embodiment, the inner signal wiring 37 may include vertical wiring that serves as one or more through electrodes. The inner heat transfer wiring 38 may include horizontal heat transfer wiring and/or vertical heat transfer wiring. In some embodiments, the inner heat transfer wiring 38 may include vertical heat transfer wiring that serves as one or more through electrodes.

The fourth encapsulant 86 may be formed on the inner package 69 to cover (wholly or in part) the inner wiring structure 63, the third active chip 64, the fourth active chip 65, the fifth active chip 66, and the sixth active chip 67. In some embodiments, the fourth encapsulant 86 may include an epoxy molding compound.

FIGS. 8 to 13 are related cross-sectional diagrams illustrating a method of manufacturing a semiconductor package according to embodiments of the inventive concept.

Figure 8:
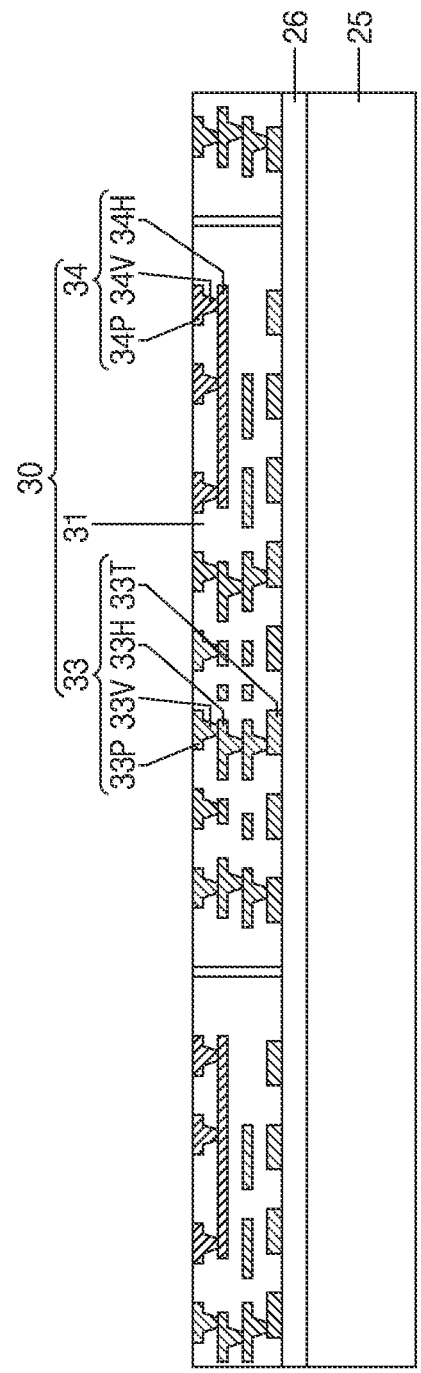
FIGS. 8, 9, 10, 11, 12, and 13 (hereafter collectively, "FIGS. 8 to 13") are related cross-sectional diagram illustrating a method of manufacturing semiconductor packages according to embodiments of the inventive concept.

Referring to FIG. 8, a buffer layer 26 may be formed on a carrier 25. A wiring structure 30 may then be formed on the buffer layer 26. In some embodiments, the carrier 25 may include a semiconductor substrate such as a silicon wafer. The buffer layer 26 may include an adhesive layer.

The wiring structure 30 may include an insulating layer 31, signal wiring 33, and heat transfer wiring 34. The insulating layer 31 may include a polymer insulating layer such as an Ajinomoto build-up film (ABF). The signal wirings 33 and the heat transfer wiring 34 may be formed (wholly or in part) within the insulating layer 31. The signal wiring 33 may include horizontal wiring 33H, vertical wiring 33V, upper pads 33P, and/or lower pads 33T. The horizontal wiring 33H, the vertical wiring 33V, the upper pads 33P, and lower pads 33T may be variously interconnected according to purpose and design.

The heat transfer wiring 34 may include horizontal heat transfer wiring 34H, vertical heat transfer wiring 34V, and/or upper heat transferring pads 34P. The horizontal heat transfer wiring 34H, the vertical heat transfer wiring 34V, and the upper heat transferring pads 34P may be variously interconnected according to purpose and design. The heat transfer wiring 34 may be spaced apart from the signal wiring 33.

Each of the vertical wiring 33V and the vertical heat transfer wiring 34V may characterized by a width that decreases as the vertical wiring 33V and the vertical heat transfer wiring 34V vertically descend (e.g., downward vertical extensions). Each of the vertical wiring 33V and the vertical heat transfer wiring 34V may include a via plug. The heat transfer wiring 34 may include one or more material(s) common to the signal wiring 33, and mat therefore be simultaneously formed during fabrication of the wiring structure.

Figure 9:
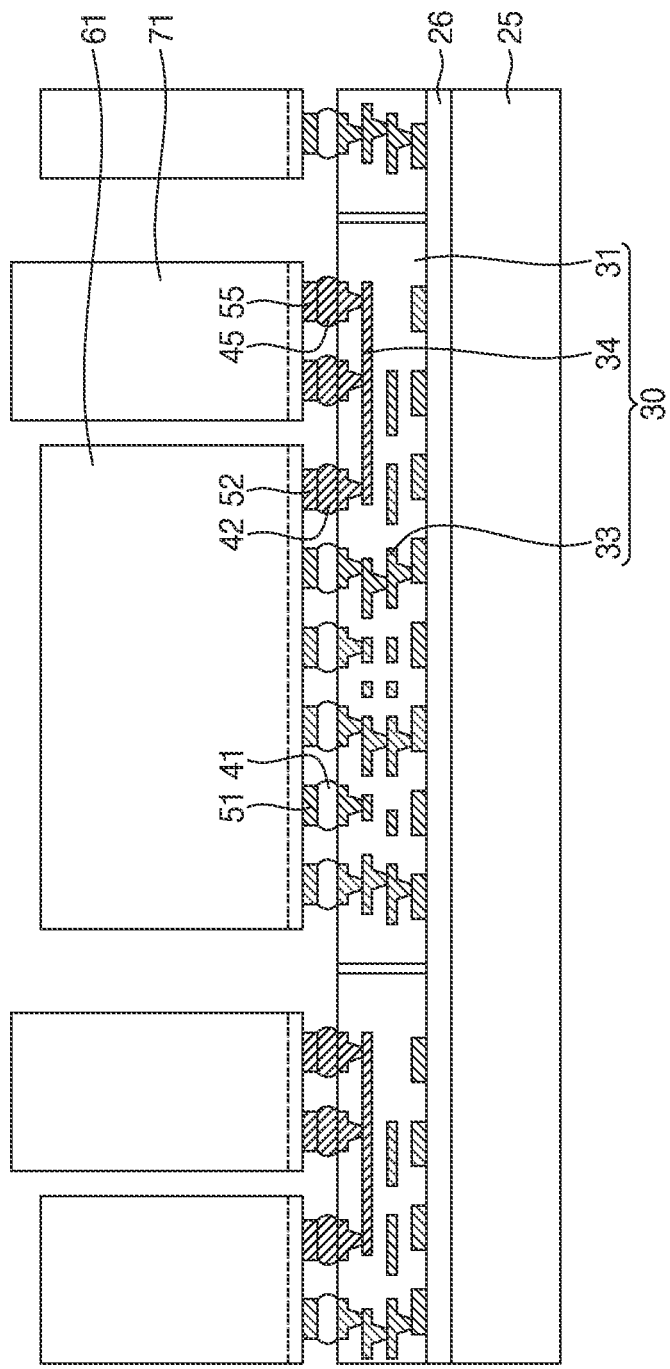

Referring to FIG. 9, a first active chip 61 and a passive chip 71 may be respectively mounted on the wiring structure 30. In some embodiment, the passive chip 71 may a first thickness greater than a second thickness for the first active chip 61. Thus, an upper surface of the passive chip 71 may vertically extension to a higher level than an upper surface of the first active chip 61. (FIG. 9 illustrates a wafer level manufacturing of multiple semiconductor packages, each including a first active chip 61 and a passive chip 71).

The first active chip 61 may include signal pad(s) 51 and first heat transferring pad(s) 52. The passive chip 71 may include second heat transferring pad(s) 55. Various signal terminals 41 and first heat transferring terminal(s) 42 may be formed between the first active chip 61 and the wiring structure 30. Each of the signal terminals 41 may selectively contact one of the signal pads 51 and/or the upper pads 33P. (See, e.g., FIG. 8) Each of first heat transferring terminal(s) 42 may selectively contact one of the first heat transferring pad(s) 52 and/or the vertical heat transfer wiring 34V. (See, e.g., FIG. 8). Second heat transferring terminal(s) 45 may be formed between the passive chip 71 and the wiring structure 30. Each one of the second heat transferring terminal(s) 45 may selectively contact one of the second heat transferring pad(s) 55 and/or one of the vertical heat transfer wiring 34V. (See, e.g., FIG. 8).

Each of the signal terminal(s) 41, the first heat transferring terminal(s) 42, and the second heat transferring terminal(s) 45 may be variously configured to include at least one of a solder ball, a conductive bump, an under bump metallurgy (UBM), a conductive pillar, a conductive lead, and a conductive pin. In some embodiments, the first heat transferring terminal(s) 42 and the second heat transferring terminal(s) 45 may be formed from substantially the same material(s).

Figure 10:
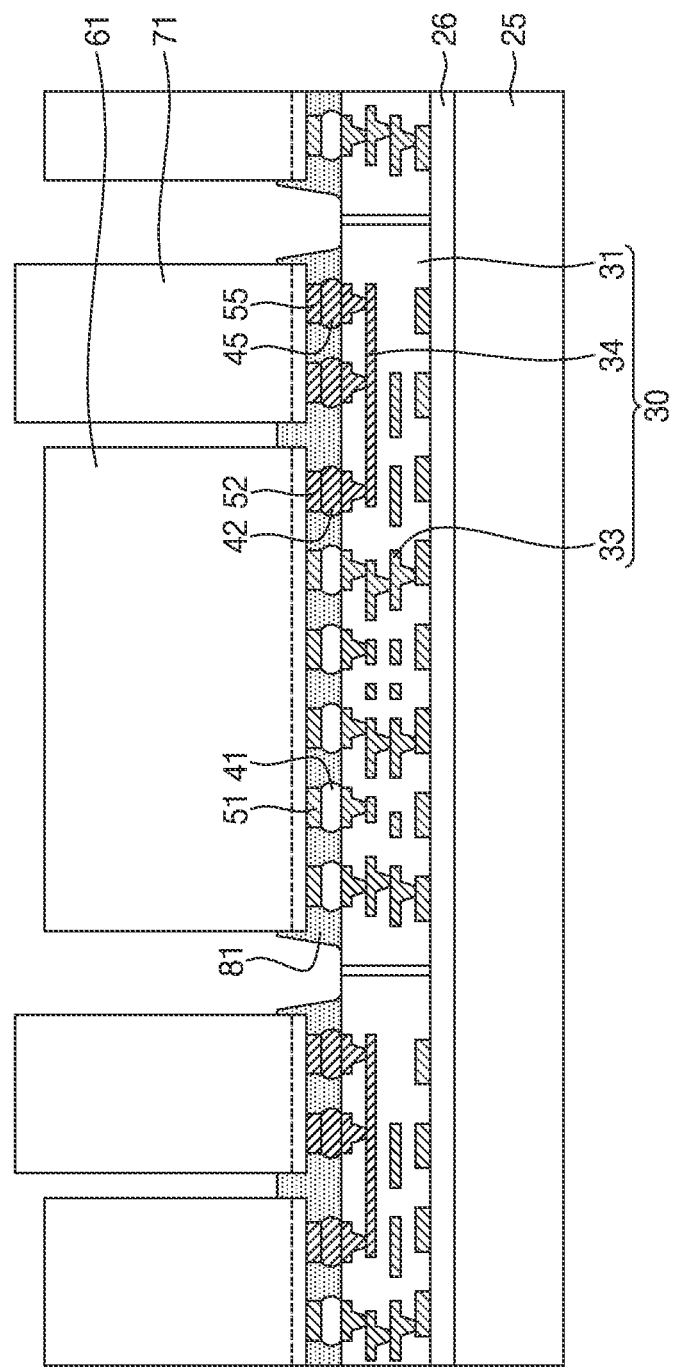

Referring to FIG. 10, a first encapsulant 81 may be formed between the wiring structure 30 and the first active chip 61, as well as between the wiring structure 30 and the passive chip 71. The first encapsulant 81 may fill (wholly or in part) a space between the wiring structure 30 and the first active chip 61, as well as a space between the wiring structure 30 and the passive chip 71. In some embodiments, the first encapsulant 81 may be formed to at least partially cover side surfaces of the first active chip 61 and side surfaces of the passive chip 71.

In some embodiments, the first encapsulant 81 may include an underfill material including a filler and a resin. The filler may include a spherical filler advantageous to securing flowability of the first encapsulant 81. The filler may include at least one of aluminum oxide ($Al_2O_3$), aluminum nitride (AlN), boron nitride (BN) and silicon oxide ($SiO_2$). In some embodiments, the first encapsulant 81 may include an epoxy molding compound. In some embodiments, the first encapsulant 81 may include a die attach film (DAF).

Figure 11:
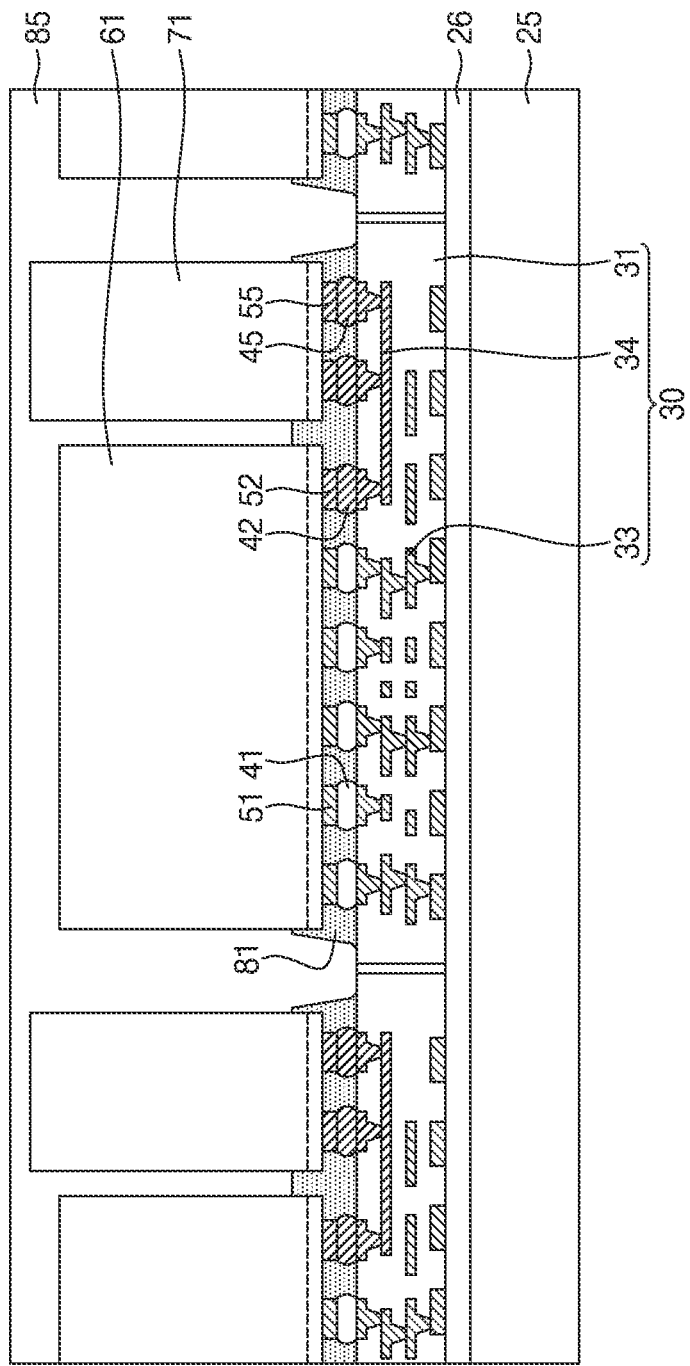

Referring to FIG. 11, a second encapsulant 85 may be formed to cover exposed portions of the first encapsulant 81, exposed portions of the wiring structure 30, an upper surface of the first active chip 61, exposed portions of the side surfaces of the first active chip 61, an upper surface of the passive chip 71, and exposed portions of the side surfaces of the passive chip 71. In some embodiments, the second encapsulant 85 may include an epoxy molding compound.

Figure 12:
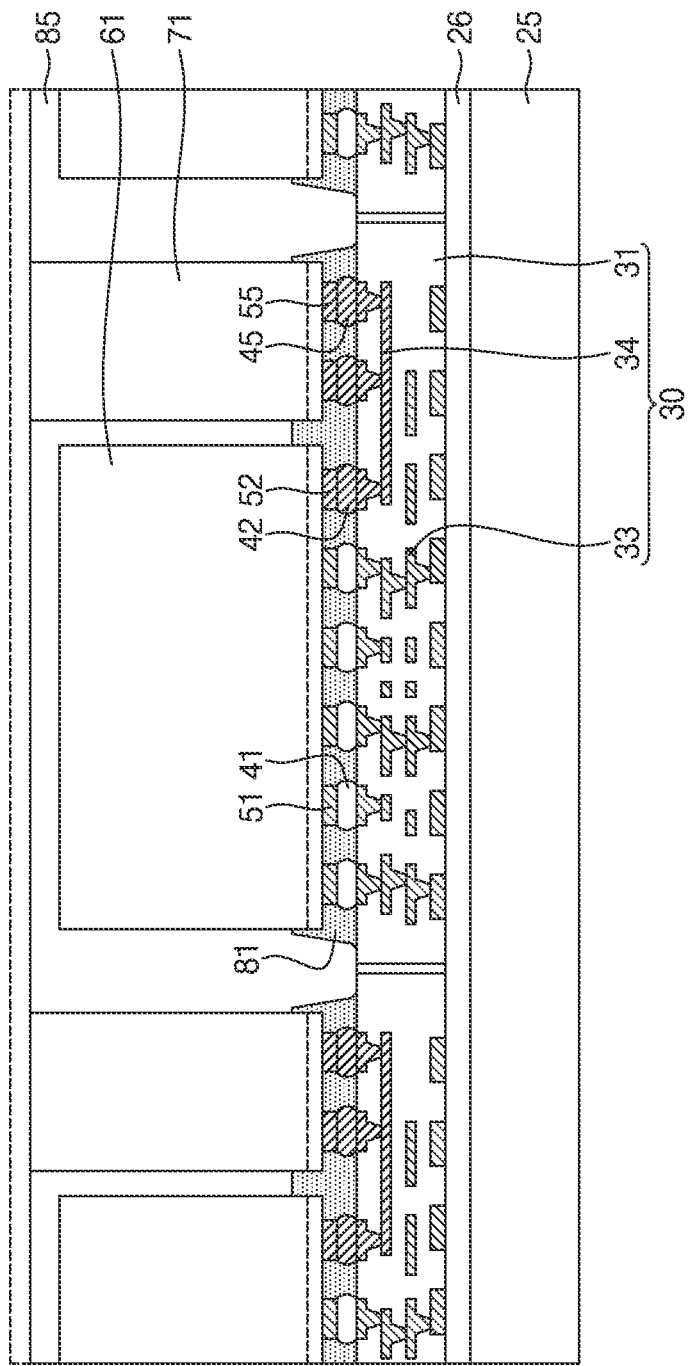

Referring to FIG. 12, an upper portion of the second encapsulant 85 may be removed to expose the upper surface of the passive chip 71, such that an upper surface of the second encapsulant 85 and the upper surface of the passive chip 71 may be substantially coplanar.

Figure 13:
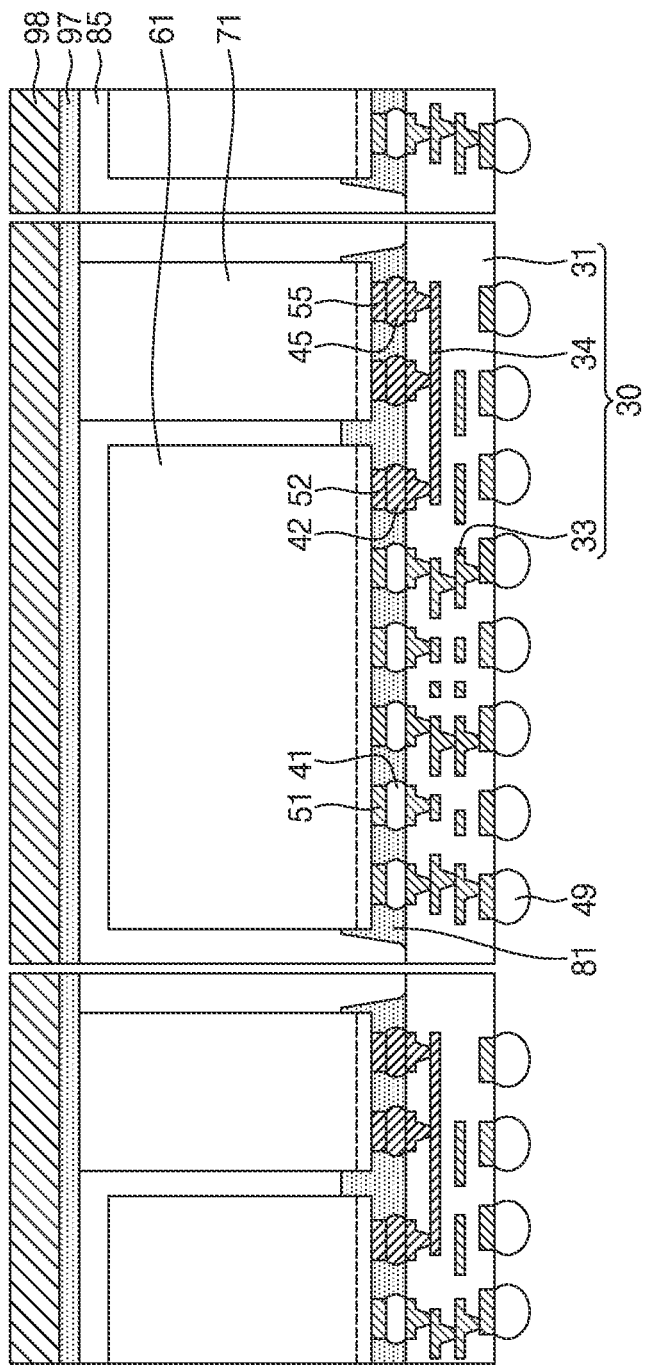

Referring to FIG. 13, a thermal interface material (TIM) layer 97 may be formed on the upper surface of the second encapsulant 85 and the upper surface of the passive chip 71, and a heat spreader 98 may be formed on the TIM layer 97.

Thereafter, the carrier 25 and the buffer layer 26 may be removed, and external terminals 49 may be formed on a lower surface of the wiring structure 30.

The external terminals 49 may be arranged to selectively contact the lower pads 33T. (See, e.g., FIG. 8). The external terminals 49 may be variously configured to include at least one of a solder ball, a conductive bump, an under bump metallurgy (UBM), a conductive pillar, a conductive lead, and a conductive pin.

Thereafter, the multiple resultant structures may be singulated to provide semiconductor packages.

As described above, embodiments of the inventive concept provide semiconductor packages including at least one active chip and at least one passive chip mounted on a wiring structure. A heat spreader may be disposed to provide thermal conductivity, particularly in relation to the passive chip. The wiring structure may include signal wiring and heat transfer wiring spaced apart from the signal wiring. Heat generated during operation of the active chip may be efficiently exhausted (e.g., diffused or spread) by a one or more thermal exhaust pathways the result for combination(s) of the heat transfer wiring, the passive chip, and the heat spreader. Semiconductor packages according to embodiments of the inventive concept that provide improved heat dissipation allow increased device integration and more reliable performance.

While the embodiments of the disclosure have been described with reference to the accompanying drawings, it will be understood by those skilled in the art that various modifications may be made without departing from the scope of the inventive concept, as defined by the following claims.

What is claimed is:

1. A semiconductor package comprising:
    a wiring structure including signal wiring and a heat transfer wiring spaced apart from the signal wiring;
    an active chip on the wiring structure;
    a signal terminal disposed between the wiring structure and the active chip;
    a first heat transferring terminal disposed between the wiring structure and the active chip and connected to the heat transfer wiring;
    a passive chip on the wiring structure;
    a second heat transferring terminal disposed between the wiring structure and the passive chip and connected to the heat transfer wiring; and
    a heat spreader on the passive chip,
    wherein the passive chip is an electrically inactive dummy chip, and
    wherein the heat transfer wiring is a single wiring in the wiring structure, and the plurality of first heat transferring terminals and the plurality of second heat transferring terminals are commonly connected to the single wiring.

2. The semiconductor package according to claim 1, wherein the passive chip has a first thickness greater than a second thickness of the active chip.

3. The semiconductor package according to claim 1, wherein vertical spacing between the passive chip and the heat spreader is less than vertical spacing between the active chip and the heat spreader.

4. The semiconductor package according to claim 1, wherein the signal terminal, the first heat transferring terminal, and the second heat transferring terminal includes at least one of a solder ball, a conductive bump, an under bump metallurgy (UBM), a conductive pillar, a conductive lead, and a conductive pin.

5. The semiconductor package according to claim 1, further comprising:
    a first encapsulant between the wiring structure and the active chip and between the wiring structure and the passive chip,
    wherein the first encapsulant includes an underfill material including a filler and a resin.

6. The semiconductor package according to claim 1, further comprising:
    a second encapsulant covers exposed portions of the wiring structure and exposed portions of side surfaces of the passive chip.

7. The semiconductor package according to claim 6, wherein the second encapsulant covers exposed side surface of the active chip.

8. The semiconductor package according to claim 6, wherein the second encapsulant extends between the exposed portions of the wiring structure and the heat spreader.

9. The semiconductor package according to claim 1, further comprising:

a thermal interface material layer between the passive chip and the heat spreader.

10. The semiconductor package according to claim 9, wherein the thermal interface material layer directly contacts an upper surface of the passive chip.

11. The semiconductor package according to claim 9, wherein the thermal interface material layer directly contacts an upper surface of the active chip.

12. The semiconductor package according to claim 9, wherein the thermal interface material layer extends between the active chip and the heat spreader.

13. The semiconductor package according to claim 1, further comprising:
  a through electrode extending through the passive chip between the second heat transferring terminal and the heat spreader.

14. A semiconductor package comprising:
  a wiring structure including signal wiring and a heat transfer wiring;
  an active chip on the wiring structure and connected to the signal wiring and the heat transfer wiring;
  a passive chip on the wiring structure and connected to the heat transfer wiring; and
  a heat spreader on the passive chip,
  wherein the passive chip is an electrically inactive dummy chip, and
  wherein the heat transfer wiring is a single wiring in the wiring structure, and wherein the active chip and the passive chip are commonly connected to the single wiring.

15. The semiconductor package according to claim 14, wherein the wiring structure includes at least one of a redistribution layer, a printed circuit board, an interposer substrate, a logic chip, a buffer chip, a controller chip, an application processor chip, an interposer chip, a volatile memory chip and a non-volatile memory chip.

16. A semiconductor package comprising:
  a redistribution layer including signal wiring and a heat transfer wiring;
  an active chip on the redistribution layer;
  a signal terminal between the redistribution layer and the active chip;
  a first heat transferring terminal between the redistribution layer and the active chip and connected to the heat transfer wiring;
  a passive chip on the redistribution layer;
  a second heat transferring terminal disposed between the redistribution layer and the passive chip and connected to the heat transfer wiring;
  a heat spreader on the passive chip;
  an external terminal on a lower surface of the redistribution layer; and
  an encapsulant disposed on the redistribution layer between the active chip and the heat spreader,
  wherein the passive chip is an electrically inactive dummy chip, and
  wherein the heat transfer wiring is a single wiring in the wiring structure, and wherein the first heat transferring terminal and the second heat transferring terminal are commonly connected to the single wiring.

17. The semiconductor package according to claim 16, further comprising:
  a thermal interface material layer between the passive chip and the heat spreader, and between the active chip and the heat spreader.

18. The semiconductor package according to claim 17, wherein the thermal interface material layer directly contacts the passive chip.

19. The semiconductor package according to claim 16, wherein the encapsulant includes an epoxy molding compound.

* * * * *